(12) United States Patent
Sondergeld

(10) Patent No.: US 6,210,844 B1
(45) Date of Patent: Apr. 3, 2001

(54) PROTECTIVE LAYER FOR COLOR PROOFS

(75) Inventor: Manfred Adelhard Josef Sondergeld, Muehlheim (DE)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/334,796

(22) Filed: Jun. 16, 1999

(51) Int. Cl.⁷ .................................................... G03C 3/00
(52) U.S. Cl. .................................. 430/11; 430/17; 430/18; 430/961; 430/14
(58) Field of Search ............................ 430/11, 15, 18, 430/961, 531, 14, 17

(56) References Cited

U.S. PATENT DOCUMENTS

| | | | |
|---|---|---|---|
| 3,649,268 | 3/1972 | Chu et al. ......................... | 96/27 R |
| 4,053,313 | 10/1977 | Fan ................................. | 96/36 |
| 4,174,216 | 11/1979 | Cohen et al. ...................... | 96/14 |
| 4,329,420 | 5/1982 | Bopp ............................... | 430/293 |
| 4,632,897 * | 12/1986 | Barzynski et al. ................. | 430/260 |
| 4,719,169 * | 1/1988 | Platzer et al. ................... | 430/258 |
| 4,857,401 | 8/1989 | Sieverding ........................ | 428/336 |
| 5,310,639 * | 5/1994 | Lushington et al. ................ | 430/539 |
| 5,407,792 * | 4/1995 | Rüger .............................. | 430/536 |
| 5,501,940 * | 3/1996 | Bloom et al. ..................... | 430/253 |
| 5,609,993 * | 3/1997 | Hase et al. ....................... | 430/302 |
| 5,620,819 * | 4/1997 | Conforti et al. ................... | 430/14 |

FOREIGN PATENT DOCUMENTS

| | | | |
|---|---|---|---|
| 0 285 039 | 3/1988 | (EP) | ............... G03F/3/10 |
| 0 365 355 | 10/1989 | (EP) | ............... G03F/3/10 |
| 0 385 466 | 3/1990 | (EP) | ............... G03F/7/34 |
| 0 462 330 A1 | 6/1990 | (EP) | ............... G03C/11/12 |
| 0 455 213 A1 | 4/1991 | (EP) | ............... G41M/5/00 |
| 0 664 018 A1 | 1/1993 | (EP) | ............... G03F/3/10 |
| 0 600 262 A2 | 11/1993 | (EP) . | |
| 0 738 929 A2 | 4/1996 | (EP) | ............... G03F/7/09 |
| 0 772 089 A2 | 10/1996 | (EP) | ............... G03F/3/10 |
| WO 95/06564 | 3/1995 | (WO) | ............... B41M/3/12 |

* cited by examiner

*Primary Examiner*—Janet Baxter
*Assistant Examiner*—Amanda C. Walke

(57) ABSTRACT

Element for laminating on color proofs, comprising a strippable support film A and a transparent, photoinsensitive protective layer B, containing at least one polymer having a melting point Tm of $\geq 50°$ C. and a glass transition temperature Tg of $\leq 0°$ C.

11 Claims, No Drawings

PROTECTIVE LAYER FOR COLOR PROOFS

The invention relates to a protective layer on color proofs. More particularly, this invention relates to a protective polymeric layer for color proofs, a process for applying the protective layer on a color proof, and a color proof provided with a protective layer.

Screened color separations are used in reprography as copy originals for preparing offset or letterpress printing plates. Before the printing plates are exposed, the color separations are checked with the aid of color proofing processes for whether the subsequent printing result is a tonally accurate reproduction of the original.

Such color proofing processes use, for example, photosensitive recording materials with which the image is produced by using adhesion differences in the exposed and unexposed areas of the photosensitive layer. A positive-working reproduction process is disclosed in U.S. Pat. No. 3,649,268 in which a tacky photopolymerizable recording material is laminated on an image support and hardened by imagewise exposure. The exposed image areas lose their tackiness. The image can then be developed by applying colored particulate materials such as toners or pigments which selectively adhere to the unexposed tacky image areas. A negative-working process is described in U.S. Pat. No. 4,174,216 which teaches a negative-working element a support; a tacky, non-photosensitive contiguous layer; a photohardenable photoadherent layer; and a strippable cover sheet. After imagewise exposure to actinic radiation, the coversheet is peeled away, carrying with it the exposed areas of the photoadherent layer and revealing the tacky contiguous layer beneath. These tacky areas may then be toned with, for example, finely divided particulate material. Different colored layers can be prepared and assembled in register over one another to form multilayer color proofs, as is well know to those skilled in the art. U.S. Pat. No. 4,053,313 describes a similar negative-working system which is developed by solvent washout.

Other known photosensitive recording materials for preparing color proofs include precolored layers instead of tonable photosensitive layers, whereby the exposed material is developed by washoff with solvents as well as by peel-apart methods. The prior art also includes systems wherein the tackiness is increased by exposure to actinic radiation instead of being reduced as in the systems described above.

Color proofs are generally provided with an added protective layer to protect against mechanical and chemical interactions. For this purpose, a layer of a photopolymerizable material can be applied and polymerized overall, as described in U.S. Pat. No. 4,174,216. This process has the disadvantage that an additional exposure step is necessary. Further, there are various special protective layers of non-photosensitive materials. Double layer materials having an antiblocking layer and an adhesion layer are described in EP-B 0 242 655. Similarly, a combination of an actual protective layer of synthetic resin films and an adhesion layer is described in U.S. Pat. No. 4,329,420. Single layer materials are described in EP-B 0 285 039 and EP-B 0 365 355. According to EP-B 0 285 039, mixtures of special incompatible polymers are used. According to EP-B 0 365 355, thermoplastic resins having a Tg of 50 to 80° C. must be used.

The present invention is based on the problem of making available effective protection for color proofs against mechanical and chemical interactions, such protection having properties stable during storage of the color proofs at room temperature, without damaging the resolution or the tonal reproduction of the color proofs, or distorting the color images and without added processing steps or added auxiliary layers being required.

SUMMARY OF THE INVENTION

The present invention is directed to an element comprising a strippable support film and at least one protective layer including at least one polymer having a melting point Tin of at least about 50° C. and a glass transition temperature Tg of at most about 0° C. The element of the present invention is especially useful to provide a protective layer on proofs.

In another embodiment, the invention is directed to an article comprising an image disposed on at least one surface of a substrate, the image optionally comprising multiple color images, and a protective layer on the image-bearing surface of the substrate, characterized in that the protective layer includes at least one polymer having a melting point Tm of at least about 50° C. and a glass transition temperature Tg of at most about 0° C.

In still another embodiment, the invention is directed to a process for applying a protective layer on an image-bearing surface to form an article having an image disposed on at least one surface of a substrate, the image optionally comprising multiple color images, and a protective layer on the image-bearing surface of the substrate, characterized in that the protective layer includes at least one polymer having a melting point Tm of at least about 50° C. and a glass transition temperature Tg of at most about 0° C., the process comprising:

providing an element comprising a support film and a protective layer, the protective layer having a free surface and an opposing support surface adjacent the support film;

adhering the free surface of the protective layer to the image-bearing surface, the image-bearing surface optionally comprising multiple color images; and removing the support film, whereby the protective layer is transferred onto the image bearing surface.

The invention itself, together with further objects and attendant advantages, will best be understood by reference to the following detailed description of the preferred embodiment.

DETAILED DESCRIPTION OF THE PREFERRED EMBODIMENT

Protective Element:

The element for application to an image-bearing surface comprises a strippable support film and at least one protective layer including at least one polymer having a melting point Tm of at least about 50° C. and a glass transition temperature Tg of at most about 0° C. Mixtures of polymers having the above characteristics may also be used in the non-photosensitive protective layer. In a preferred embodiment, the protective layer is transparent and non-photosensitive.

The protective element of this invention may be applied to many types of image-bearing surfaces. Some examples of image-bearing surfaces include Cromalin® proofs, Easyprint® proofs, etc.

The protective layer can be prepared by known methods. For this purpose, they can be coated on suitable supports from currently available solvents, preferably organic solvents, such as, for example, methylene chloride, toluene/methanol mixtures, or other mixtures of aromatic solvents and alcohols, esters, or ketones, and subsequently dried.

The thickness of the protective layer is usually about 1–20 $\mu$m, preferably about 3–15 $\mu$m, and particularly preferred at about 5–10 μm. A composite of two or more layers is also possible for this protective element. Two or more layers having the above specified thermoplastic polymers can be applied on the support successively or simultaneously by known methods. The layers of such multilayer protective elements can have the same or different compositions. Single-layer elements are preferred.

Polymer:

Useful polymers have a melting point Tm of at least about 50° C. and a glass transition temperature of at most about 0° C. Preferred polymers have a melting point Tm of about 50–120° C., particularly about 50–100° C., and a glass transition temperature Tg of at most about –20° C., particularly at most about –40° C. Suitable polymers include, for example, polyethylene oxides, polypropylene oxides, polytetrahydrofurans, polycaprolactones and combinations thereof. Polycaprolactones, polyethylene oxides and polypropylene oxides are particularly preferred, especially polycaprolactones. The polymer is present in the amount of from about 80 to about 100% by weight, preferably from about 90 to about 100% by weight, based on the total weight of the layer.

Additives:

The protective layer can also contain additives, such as, for example, UV absorbers, optical brighteners, fillers, surfactants, and antistatic agents. In particular, addition of fillers, such as, for example, silicates, aluminum oxides, and silicon dioxides, etc., are advantageous. Pyrogenic and precipitated silicic acids are preferred. Fillers are present in the amount of from 0 to about 15% by weight, preferably from 0 to about 10% by weight, based on the total weight of the layer.

Supports:

Suitable supports are, for example, synthetic resin films of polyethylene, polypropylene, polyamides, or polyesters. Polyethylene terephthalate films are particularly preferred. Supports having smooth or rough surfaces can be used. Support films having release layers or ED-treated support films are also suitable. The thickness of the support is usually at least about 12 μm, preferably about 20–130 μm, particularly preferred at about 20–75 μm.

Image Bearing Surfaces:

The protective layer is suitable for use on all current proofs. Examples are positive-working recording materials described in U.S. Pat. No. 3,649,268, negative-working materials described in U.S. Pat. No. 4,174,216 and U.S. Pat. No. 4,053,313, and materials having precolored recording layers as described in U.S. Pat. No. 4,260,673. The colored image may optionally include multiple color images.

The protective layer can also be useful on other image bearing surfaces such as, for example, photographic images, disublimation images, and laser ablation/inkjet images.

Process:

The protective layer can be applied with current commercial laminators onto a commercial color proofing material having an image-bearing surface. This image bearing surface may optionally contain multiple color images. Rolls as well as sheet stock can be used. The temperature of the laminator rollers is usually about 60–150° C., preferably about 70–130° C., particularly preferred at about 90–120° C. The support film is stripped off manually or automatically, transferring the protective layer completely onto the image bearing surface of the color proof. The support film is stripped off preferably after the color proof has cooled to room temperature.

The following examples illustrate the invention. Parts and percentages are by weight, unless otherwise stated. The average molecular weights of the polymers are given as weight average {Mw}.

EXAMPLE 1

8.28 g Capa® 240 manufactured by Solvay Interox, Warrington, Great Britain (Mw 4000, melting range Tm 55–60° C., glass transition temperature range Tg –60 to –70° C.) and 8.28 g Capa® 650 manufactured by Solvay Interox, Warrington, Great Britain (Mw 50,000, melting range Tm 58–60° C., glass transition temperature range Tg –60 to –70° C.) were dissolved at room temperature in a solvent mixture of 71.4 g toluene and 30.6 g methanol. Then, 1.44 g Acematt® OK 607 manufactured by Degussa, Frankfurt, Germany were dispersed in this solution with a blade agitator. This coating dispersion was applied on a smooth polyester film that had not been surface-treated (Mylar® 92A from E. I. du Pont de Nemours and Company, Wilmington, Del.) and dried. The dry layer thickness was 5 μm. This element was laminated on a four-color Cromalin® proof in a commercial Cromalin® Whiteline laminator from the DuPont Company at 120° C. roller temperature. After cooling to room temperature, the polyester film was stripped off. A color proof was obtained with a glossy, hard, and nontacky surface. When the color proof was flexed, the protective layer remained elastic and did not flake off.

EXAMPLE 2

A coating solution was made, as in Example 1, of 16.66 g Capa® 650 in 71.4 g toluene and 30.6 g methanol and applied on a smooth polyester film (Mylar® 92A) having a silicone layer. After drying, the coating thickness was 10 μm. This element was laminated on an Easyprint® four-color proof in an Easyprint® laminator from the DuPont Company at 110° C. roller temperature. After cooling to room temperature, the polyester film was stripped off. A color print having a glossy, hard, and nontacky surface was obtained. When the color proof was flexed, the protective layer remained elastic and did not flake off.

EXAMPLE 3

A coating dispersion was made, as in Example 1, of 16.56 g Capa® 650, 1.44 g Acematt® OK 607, 71.4 g toluene and 30.6 g methanol and applied on a smooth polyester film (Mylar® 92A) having a silicone layer. After drying, the coating thickness was 10 μm. This element was laminated on an Easyprint® four-color proof in an Easyprint® laminator from the DuPont Company at 110° C. roller temperature. After cooling to room temperature, the polyester film was stripped off. A color print having a glossy, hard, and nontacky surface was obtained. When the color proof was flexed, the protective layer remained elastic and did not flake off.

EXAMPLE 4

A coating dispersion was made, as in Example 1, of 9.9 g Capa® 240, 6.66 g Capa® 650, 1.44 g Acematt® OK 607, 71.4 g toluene and 30.6 g methanol and applied on a rough polyester film that had not been surface-treated (Mylar® 92 EB 11 from the DuPont Company). After drying, the coating thickness was 10 μm. This element was laminated on an Easyprint® four-color proof in an Easyprint® laminator from the DuPont Company at 110° C. roller temperature. After cooling to room temperature, the polyester film was stripped off. A color print having a matte, hard, and nontacky surface was obtained. When the color proof was flexed, the protective layer remained elastic and did not flake off.

EXAMPLE 5

2.88 g polyethylene glycol PEG 8000 manufactured by Union Carbide, Tarrytown, N.Y. and 5.4 g polyethylene oxide WSRN 10 manufactured by Union Carbide, Tarrytown, N.Y. were dissolved at room temperature in a solvent mixture of 45.90 g toluene and 5.10 g methanol. This coating solution was applied on a smooth polyester film that had not been surface-treated (Mylar® 92A) and dried. The dry layer thickness was 5 μm. This element was laminated on a four-color Cromalin® proof as described in Example 1. After cooling to room temperature, the polyester film was stripped off. A color proof was obtained with a glossy, hard, and nontacky surface. When the color proof was flexed, the protective layer remained elastic and did not flake off.

EXAMPLE 6

Several of each of the color proofs prepared in Examples 1–5 were stored for 24 hrs. at 40° C. in a hot box. The color proofs were stored partially front to front and partially front to back. This stack was loaded with a weight of 500 g/dm². No changes occurred in the color proof surfaces and the color proofs were separated without difficulty.

Of course, it should be understood that a wide range of changes and modifications can be made to the preferred embodiment described above. It therefore is intended that the foregoing detailed description be regarded as illustrative rather than limiting and that it be understood that it is the following claims, including all equivalents, which are intended to define the scope of this invention.

What is claimed is:

1. A protected proof of a color image comprising a color image bearing surface having a color separation image formed on the surface by imagewise exposure and development of a photopolymerizable recording material and at least one protective layer on the image bearing surface, the protective layer including at least one polymer having a melting point Tm of at least about 50° C. and a glass transition temperature Tg of at most about 0° C., and wherein the protective layer protects the color separation image during storage from mechanical and chemical interactions.

2. The proof according to claim 1, wherein the melting point Tm of the protective layer polymer is from about 50 to about 100° C.

3. The proof according to claim 2, wherein the glass transition temperature Tg of the protective layer polymer is at most about −20° C.

4. The proof according to claim 1, wherein the polymer is selected from polyethylene oxides, polypropylene oxides, polytetrahydrofurans, polycaprolactones and combinations thereof.

5. The proof according to claim 1, wherein the protective layer also includes an inert filler.

6. The proof according to claim 1, wherein the protective layer has a thickness of from about 3 to about 15 μm.

7. A process for applying a protective layer on an image-bearing surface, the process comprising:

providing an element comprising a support film A and a protective layer B including at least one polymer having a melting point Tm of at least about 50° C. and a glass transition temperature Tg of at most about 0° C., the protective layer B having a free surface and an opposing support surface adjacent to the support film A;

adhering the free surface of the protective layer B to the image-bearing surface, the image-bearing surface optionally comprising multiple color separation images, and removing the support film A, whereby the protective layer B is transferred onto the image-bearing surface.

8. The process according to claim 7, wherein the support film A has a rough surface adjacent to the support surface.

9. The process according to claim 7, wherein the support film A has a smooth surface adjacent to the support surface.

10. The process according to claim 7, wherein the support film A is strippable and the removal step is accomplished by peeling away the support film A.

11. The process according to claim 7, wherein the free surface of the protective layer B is adhered to the image-bearing surface by lamination.

* * * * *